US012699431B2

(12) United States Patent  
Hendrix

(10) Patent No.: US 12,699,431 B2  
(45) Date of Patent: Aug. 4, 2026

(54) POWER AND BACKUP SYSTEM FOR LOW POWER OUTDOOR APPLICATIONS

(71) Applicant: viaPhoton, Inc., Aurora, IL (US)

(72) Inventor: Walter Mark Hendrix, Dallas, TX (US)

( * ) Notice: Subject to any disclaimer, the term of this patent is extended or adjusted under 35 U.S.C. 154(b) by 0 days.

(21) Appl. No.: 18/655,084

(22) Filed: May 3, 2024

(65) Prior Publication Data

US 2024/0370071 A1 Nov. 7, 2024

Related U.S. Application Data

(60) Provisional application No. 63/499,968, filed on May 3, 2023.

(51) Int. Cl.  
    *G06F 1/26*     (2006.01)  
    *H02J 9/06*     (2006.01)  
    *H05K 7/14*     (2006.01)  
(52) U.S. Cl.  
    CPC .............. *G06F 1/263* (2013.01); *H02J 9/066* (2013.01); *H05K 7/1457* (2013.01); *H05K 7/1488* (2013.01); *H05K 7/1492* (2013.01); *H05K 7/1497* (2013.01)

(58) Field of Classification Search  
CPC ..... G06F 1/263; H02J 9/00; H02J 9/08; H02J 9/06; H02J 9/066; H05K 7/1488; H05K 7/1492; H05K 7/1497  
See application file for complete search history.

(56) References Cited

U.S. PATENT DOCUMENTS

| | | | | |
|---|---|---|---|---|
| 6,441,505 | B1 * | 8/2002 | Poletti | .................... F02B 63/04 |
| | | | | 290/1 A |
| 2017/0064637 | A1 | 3/2017 | Harrington | |
| 2021/0298195 | A1 * | 9/2021 | Barbour | .................... G06F 1/26 |
| 2022/0197358 | A1 * | 6/2022 | Gao | ........................ H02S 40/30 |
| 2023/0116806 | A1 * | 4/2023 | Newman | ............... E04H 12/345 |
| | | | | 220/1.5 |

FOREIGN PATENT DOCUMENTS

| | | | | | |
|---|---|---|---|---|---|
| CN | 204082326 | U | * | 1/2015 | |
| CN | 110920418 | A | * | 3/2020 | ............. B60L 58/24 |
| CN | 213512693 | U | * | 6/2021 | |

* cited by examiner

*Primary Examiner* — Ryan Johnson  
(74) *Attorney, Agent, or Firm* — Ferguson Braswell Fraser Kubasta PC

(57) ABSTRACT

Aspect of the invention relate to apparatuses and methods for backup power systems. The apparatus comprises a communications enclosure. The communications enclosure comprises a generator module. The generator module comprises a generator and a rack mount.

9 Claims, 9 Drawing Sheets

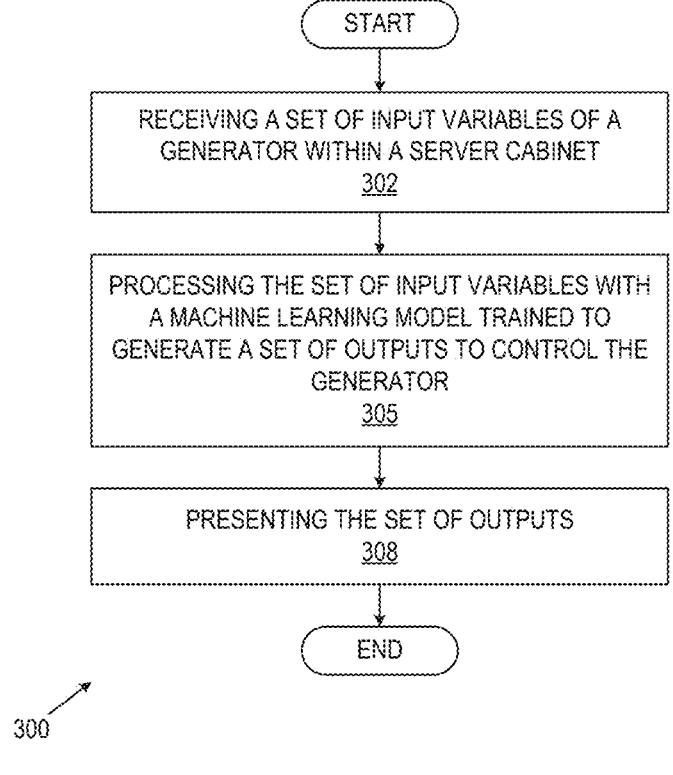
_FIGURE 3_

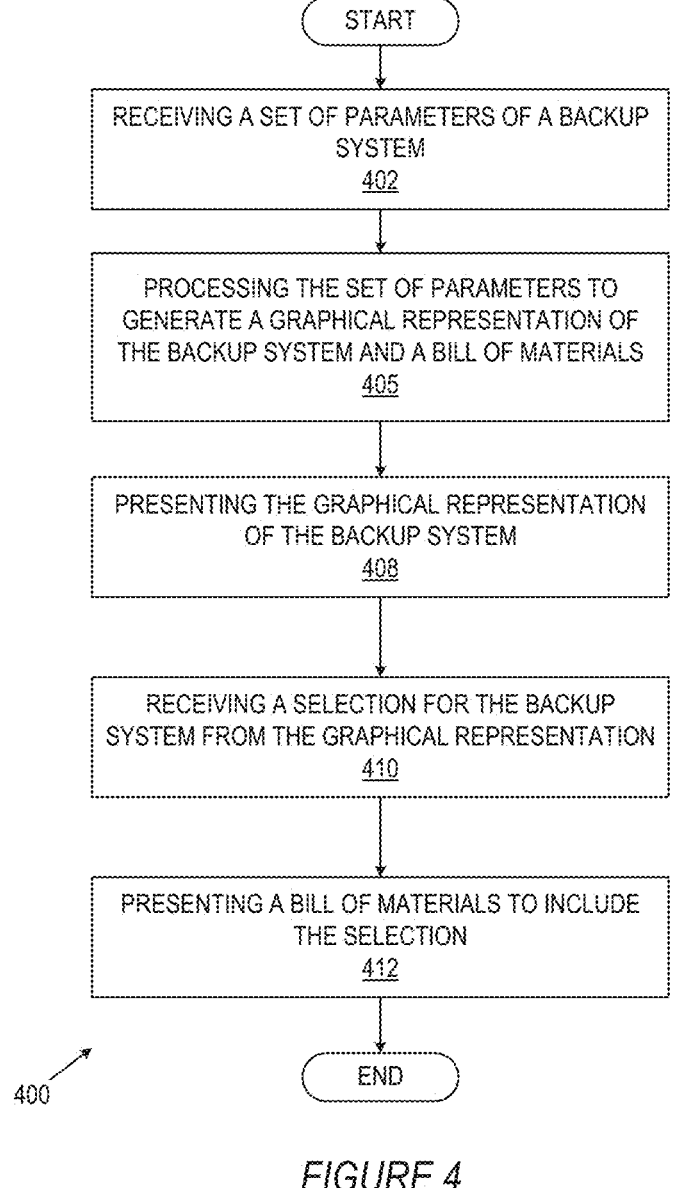

START

RECEIVING A SET OF PARAMETERS OF A BACKUP
SYSTEM
402

PROCESSING THE SET OF PARAMETERS TO
GENERATE A GRAPHICAL REPRESENTATION OF
THE BACKUP SYSTEM AND A BILL OF MATERIALS
405

PRESENTING THE GRAPHICAL REPRESENTATION
OF THE BACKUP SYSTEM
408

RECEIVING A SELECTION FOR THE BACKUP
SYSTEM FROM THE GRAPHICAL REPRESENTATION
410

PRESENTING A BILL OF MATERIALS TO INCLUDE
THE SELECTION
412

END

400

_FIGURE 4_

Configurator
Output
600

Graphical
Representation
610

Bill Of
Materials
620

POWER AND BACKUP SYSTEM FOR LOW POWER OUTDOOR APPLICATIONS

CROSS-REFERENCE TO RELATED APPLICATIONS

This application claims the benefit of U.S. Provisional Application Ser. No. 63/499,968, filed May 3, 2023, which is hereby incorporated by reference for all purposes.

BACKGROUND

Backup power systems enhance the resilience and reliability of power supply in low power outdoor applications where uninterrupted power is crucial, such as in telecommunications, remote sensing, and other infrastructural setups. These backup systems are designed to automatically engage upon detection of power interruptions, minimizing downtime and maintaining operational continuity. These backup systems may include combinations of generators, batteries, and/or renewable energy sources to provide a continuous power supply even during failures of the primary power grid.

SUMMARY

An aspect of the invention relates to an apparatus. The apparatus comprises a communications enclosure. The communications enclosure comprises a generator module. The generator module comprises a generator and a rack mount. Another aspect of the invention relates to a method. The method comprises receiving a set of input variables of a generator within a communications enclosure. The method further comprises processing the set of input variables with a machine learning model trained to generate a set of outputs to control the generator. The method also comprises presenting the set of outputs.

Yet another aspect of the invention relates to a method. The method comprises receiving a set of parameters of a backup system. The method further comprises processing the set of parameters to generate a graphical representation of the backup system and a bill of materials. The method also comprises presenting the graphical representation of the backup system. The method additionally comprises receiving a selection for the backup system from the graphical representation. The method also comprises presenting a bill of materials to include the selection.

Other aspects of the invention will be apparent from the following description and the appended claims.

BRIEF DESCRIPTION OF DRAWINGS

FIG. 3 shows a flowchart of a process for controlling a generator according to illustrative embodiments.

FIG. 4 shows a process for configuring a backup system according to illustrative embodiments.

Like elements in the various figures are denoted by like reference numerals for consistency.

DETAILED DESCRIPTION

Figure 1A:
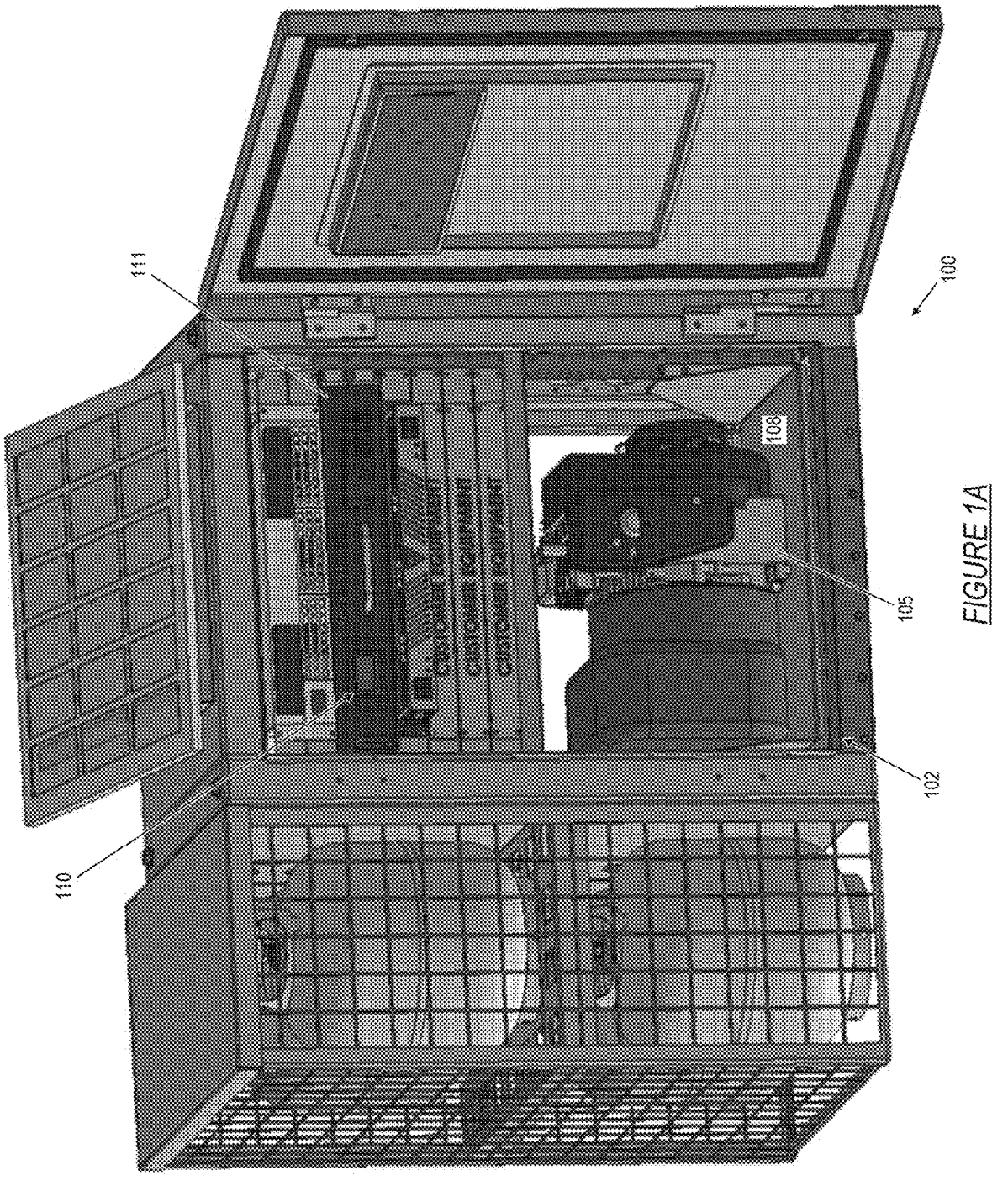
FIG. 1A, FIG. 1B, and FIG. 1C show a communications enclosure with rack mounted generator according to illustrative embodiments.

Turning to FIG. 1A, the communications enclosure (100) is configured for outdoor use in remote areas. The communications enclosure (100) includes the generator module (102) and the control module (110).

The communications enclosure (100) serves as the structural housing for various equipment necessary for power backup and telecommunications operations in outdoor environments. The communications enclosure may be constructed from durable materials that offer resistance to environmental stresses such as extreme temperatures, moisture, and/or electromagnetic interference. The communications enclosure may include features such as lockable doors and mounting racks to support secure access and organization of internal components.

The generator module (102) includes the generator (105) and the rack mount (108). The generator (105) provides power to the equipment in case power from the electrical grid is lost. The rack mount (108) secures the generator (105) to the communications enclosure (100).

The generator module (102) includes all necessary mechanisms for generating electrical power autonomously and may include features connectors and controls for integration with the power management system of the enclosure. The generator module (102) contains a fuel-powered generator capable of generating electrical energy during power outages or in areas lacking stable electrical infrastructure. The generator module (102) is supported by a rack mount (108) that secures the generator module (102) within the communications enclosure (100), aiding in vibration reduction and facilitating easier maintenance.

The generator (105) features an internal combustion engine that drives an electrical generator or alternator to produce electricity. The generator (105) may be is equipped with systems for cooling, exhaust, and fuel delivery. The electrical output from generator (105) is used to supply power where grid power is unavailable or as a backup in case of power failures.

The rack mount (108) provides a stable framework to secure the generator. The rack mount (108) is designed to accommodate the size and weight of the generator, ensuring it remains in place even under conditions of movement or external stress. The rack mount (108) may aid in the organization of space within the enclosure, simplifying the installation and removal of the generator for maintenance.

The control module (110) resides in a rack mounted smart battery module (111) and controls equipment within the communications enclosure (100). The control module (110) may include hardware and software for monitoring system status, managing power distribution, and executing emergency protocols. The control module interfaces with other systems to coordinate activities like power backup switching, system diagnostics, and remote management, often via networked communications. In one embodiment the control module (110) controls operation of the generator (105) with a machine learning model.

Solar Panels (111) may be mounted on top of the communications enclosure, supplementing the power provided by the generator and reducing reliance on non-renewable energy sources. The panels may be integrated with electrical converters and storage systems to provide a stable and usable power supply.

Figure 1B:
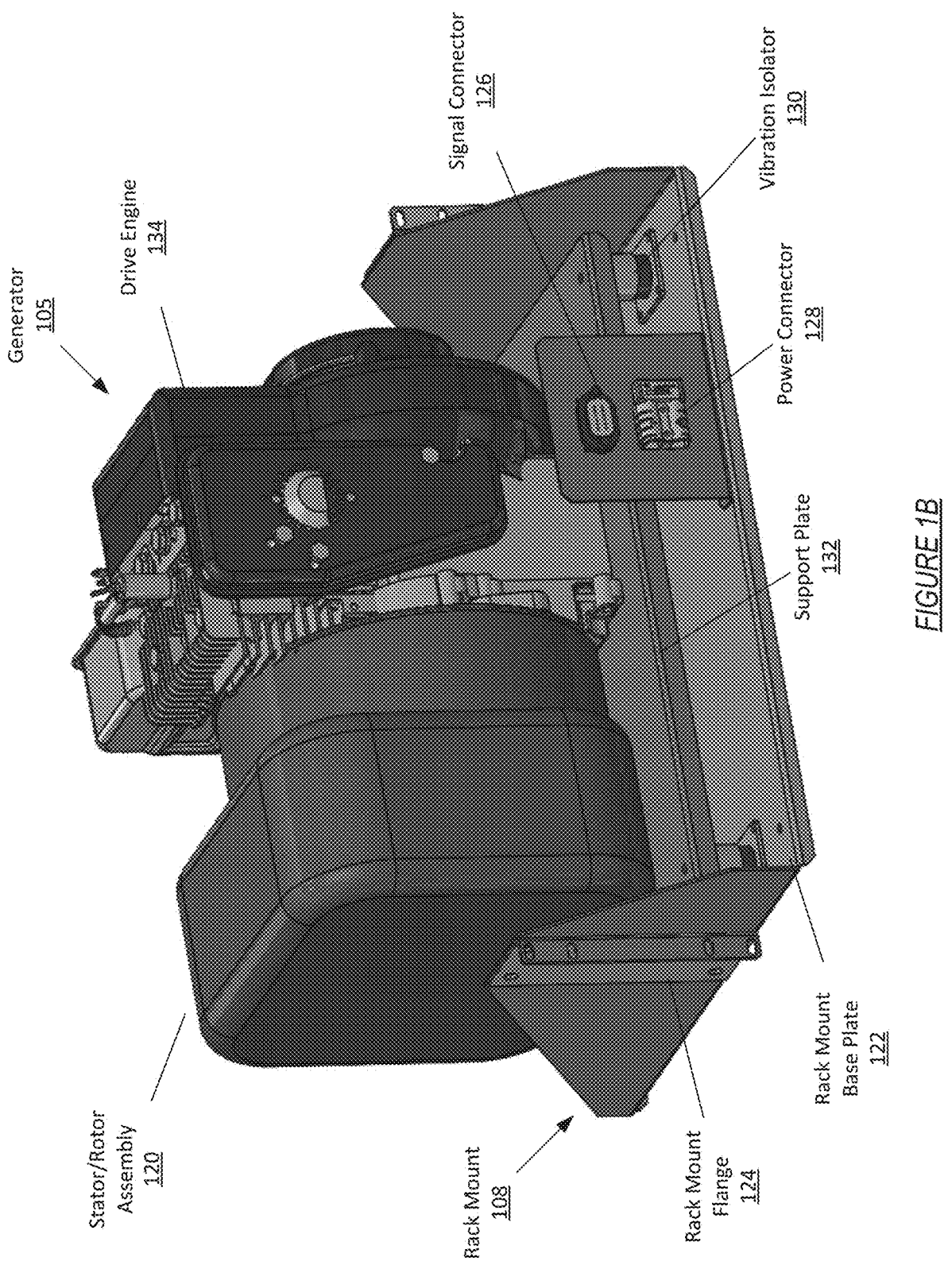

Turning to FIG. 1B, more detailed view of the generator (105) and rack mount (108) of FIG. 1 is shown.

The drive engine (134) of the generator (105) converts the chemical energy of fuel into mechanical energy through combustion. This mechanical energy is then used to drive the rotor of the generator to produce electricity. The drive engine (134) may be equipped with systems for optimizing fuel efficiency and reducing emissions, as well as features such as electronic fuel injection, variable valve timing, and advanced exhaust after-treatment systems.

The stator/rotor assembly (120) generates electricity from the mechanical energy provided by the drive engine (134). A rotor rotates around the stator, which remains stationary and contains coils of wire to produces a magnetic field as the magnetic field moves past the coils, an electric current is induced in the wire.

The rack mount base plate (122) is bolted or otherwise affixed securely within the communications enclosure (100) to ensure stability of the generator assembly. The rack mount base plate (122) may be constructed from a robust material capable of handling significant loads and vibrations.

The support plate (132) supports the generator and drive engine. Vibration isolators (130) connect the support plate (132) to the rack mount base plate (122) and are used to reduce the transmission of vibrations from the generator and engine to the mounting structure and surrounding components. The vibration isolators (130) may be constructed of materials or mechanisms that absorb or dampen vibration, such as rubber mounts or spring systems.

The rack mount flange (124) connects and secures various parts of the rack mount and generator assembly within the communications enclosure (100). The rack mount flange (124) may include multiple bolt holes that align with corresponding attachment points within the communications enclosure (100).

The signal connector (126) provides an interface for electrical signals to be transmitted to and from the generator. The signal connector (126) connects the generator (105) to the control module (110) for managing operation of the generator. The power connector (128) serves as the point of interface for electrical power output from the generator to the communications equipment mounted within the communications enclosure (100).

Figure 1C:
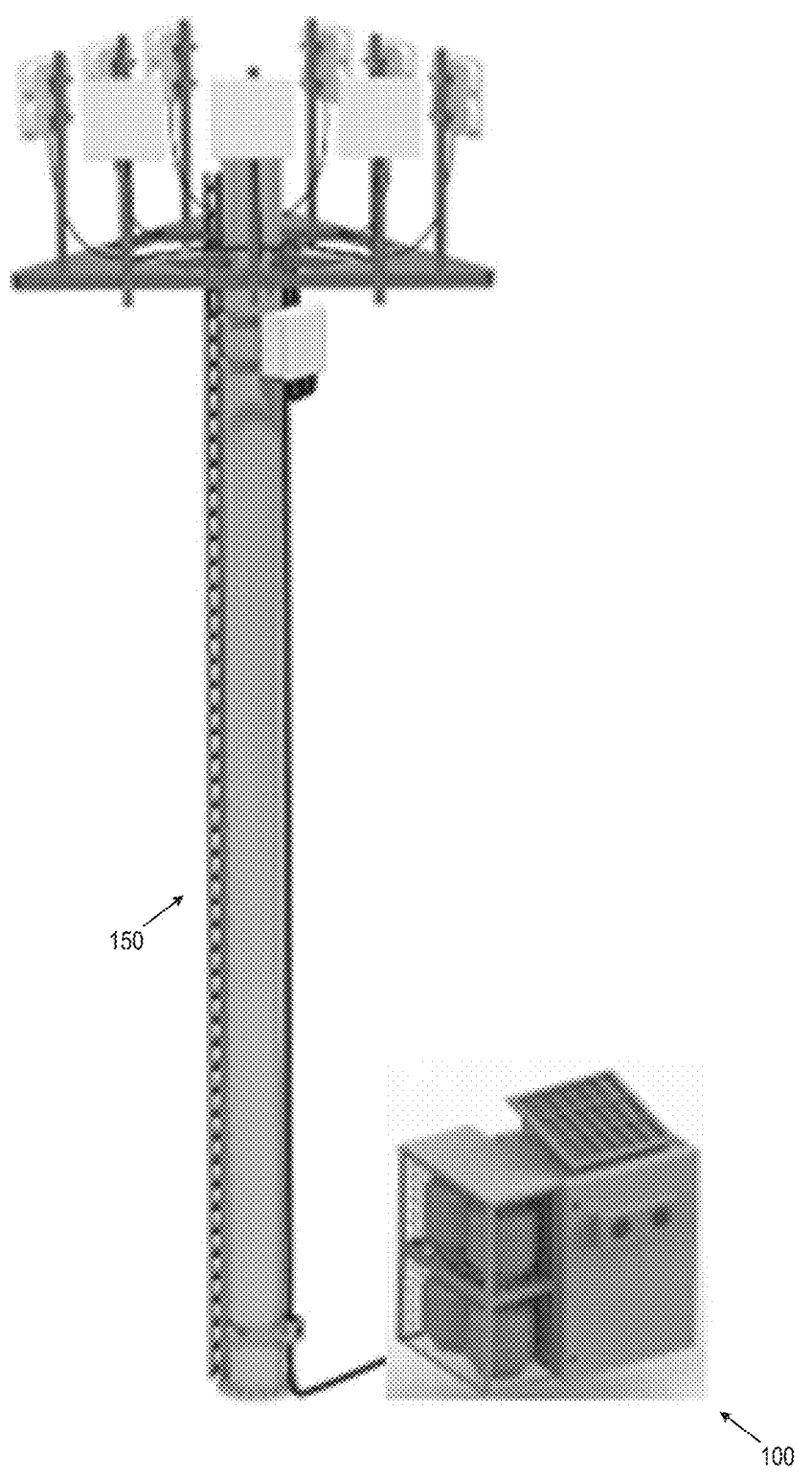

Turning to FIG. 1C, the communications enclosure (100) is installed at the base of the tower (150). The tower (150) is a communications tower with backup power provided from the communications enclosure (100). The communication cables to the tower (150) may further be routed, spliced, and interconnected through the communications enclosure (100).

Figure 2:
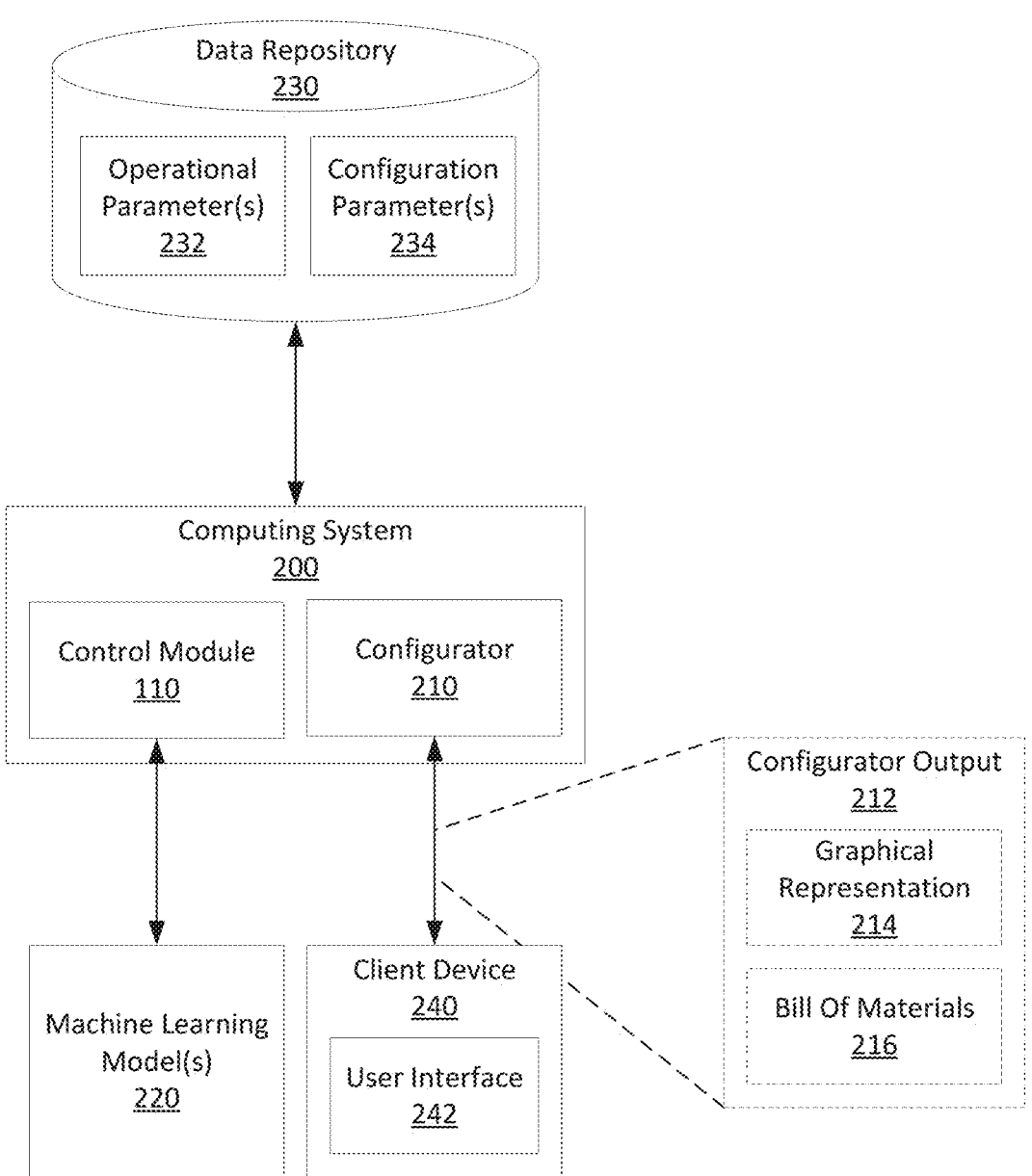
FIG. 2 shows a block diagram of a computing environment according to illustrative embodiments.

Turning now to FIG. 2, a block diagram of a computing environment is shown according to illustrative embodiments. The computing environment (200. Closed parentheses can include. One or more components for monitoring and configuring a communications enclosure, Such as communications and closure (100) of FIG. 1.

The computing system (200) is an example of computing system (700) of FIG. 7, described below. The computing system (200) acts as the central processing unit of the system, executing software-defined tasks that include data processing, control logic, and user interactions. As illustrated, the computing system (200) includes the control module (110) and the configurator (210).

The configurator (210) is software includes functionality for setting up system parameters based on user inputs and existing data models stored in the Data Repository. The configurator (210) allows for the customization of system setups through a software interface that adjusts configuration parameters to meet specific user requirements. The configurator (210) may be built using software development kits that offer rich libraries for user interface design, data handling, and model simulations, such as those available in MATLAB, LabVIEW, or bespoke software developed in-house.

The client device (240) is an example of computing system (700) of FIG. 7. The client device (240) serves as the user interface terminal from which system configurations can be viewed and adjusted.

The user interface (242) provides a graphical or textual interface on the client device (240), facilitating user interactions with the system. The user interface (242) displays system data, operational statuses, and configuration options, and collects user inputs for system adjustments. The user interface (242) may be developed using UI/UX design principles and may be implemented through web technologies like HTML, CSS, and JavaScript, or through native application frameworks.

The data repository (230) is any type of storage unit and/or device (e.g., a file system, database, data structure, or any other storage mechanism) for storing data. Further, the data repository (160) may include multiple different, potentially heterogeneous, storage units and/or devices. The data repository (230) may store operational parameters (232) and configuration parameters (234).

The operational parameters (232) are data that include real-time and historical data related to the performance and status of the system, such as power output, fuel levels, and system efficiency metrics. Configuration Parameters (234) are user-defined settings and specifications, such as component preferences and system configurations intended for different operational scenarios.

The operational parameters (232) and configuration parameters (234) encompass a range of feature and performance parameters, depending on specific operational needs. For example, the parameters may specify a generator or a battery system. If a generator is chosen, the fuel type must be determined, with options ranging from one 20-pound liquid propane (LP) tank to as many as four of the same, or alternatively, a larger 100-pound LP tank.

For both generator and battery systems, the electrical parameters include the maximum and minimum allowable system voltages and the low voltage disconnect (LVD) cutoff threshold voltage. System power consumption parameters may also be specified, both for the worst-case scenario and under typical conditions.

The system's operational timing and connectivity parameters are guided by the backup time required, the trunk power cable length, and the trunk power cable gauge size. Battery-specific parameters include the maximum allowable charge level and the allowable depth of discharge.

Parameters related to battery performance over time and under varying conditions is characterized by several de-rating factors. These include a general de-rating factor, adjustments based on the number of charge-discharge cycles, temperature exposure, and the time factor, reflecting the battery's aging and wear. A maximum allowable battery recharge current level may also be specified to optimize the charging process and prolong the battery's operational life.

The configurator output (212) includes a graphical representation (214) and a bill of materials (216). The graphical representation (214) provides a visual depiction of the system configuration, aiding in understanding and verification of the configured setup. The bill of materials (216) lists all components and materials required as per the current configuration. These outputs are dynamically generated based on user inputs and system algorithms.

In some illustrative examples, control module (110) can use an artificial intelligence system that includes one or more machine learning models (220) to make assumptions regarding performance optimization of the control module (110) . . . . The machine learning models (220) utilizes statistical and computational algorithms to optimize performance and predictive maintenance of the system based on historical and real-time data. The machine learning models (220) analyzes patterns in the data to enhance the accuracy of predictions concerning system behavior and maintenance needs.

The artificial intelligence system comprises at least one of artificial neural networks, a cognitive system, a Bayesian network, a fuzzy logic, an expert system, a natural language system, or some other suitable system. Machine learning is used to train the artificial intelligence system. Machine learning involves inputting data to the process and allowing the process to adjust and improve the function of the artificial intelligence system.

In this illustrative example, the machine learning models (220) can use diverse types of algorithms to learn based on training data input into the model. These algorithms can include at least one of a supervised learning, an unsupervised learning, a feature learning, a sparse dictionary learning, anomaly detection, association rules, or other types of learning algorithms. Examples of machine learning models include an artificial neural network, a decision tree, a support vector machine, a Bayesian network, a genetic algorithm, and other types of models. After training with an appropriate data set, the machine learning models (150) can process additional data to provide a desired output.

While FIGS. 1 and 2 show a configuration of components, other configurations may be used without departing from the scope of the invention. For example, various components may be combined to create a single component. As another example, the functionality performed by a single component may be performed by two or more components.

Turning to FIG. 3, a process for controlling a generator is shown according to illustrative embodiments. The process (300) may operate on a control module of a backup system, such as control module (110) of FIG. 1.

At Step 302, a set of input variables of a generator within a communications enclosure are received. In one embodiment, the set of input variables include a predicted battery discharge curve, system power consumption measurements, generator fuel consumption rates and measurements, system voltage measurements, low voltage disconnect (LVD) cutoff voltage parameters, battery charge level parameters, voltage level parameters, etc.

At Step 305, the set of input variables are processed with a machine learning model trained to generate a set of outputs to control the generator. In one embodiment, the machine learning model uses a machine learning algorithm, including supervised or unsupervised algorithms for linear regression, logistic regression, support vector machines, decision trees, random forests, neural networks, naïve Bayesian classifiers, gradient boosting, clustering (e.g., k-means), etc.

At Step 308 the set of outputs are presented. In one embodiment, the outputs may be transmitted to the generator to control the generator. In one embodiment, the outputs (as well as the inputs) may be transmitted to a remote computing system monitoring the performance of the generator.

Turning to FIG. 4, a process for a backup system through a web application is shown according to illustrative embodiments. The process (400) may operate on a configuration software system, such as configurator (210) of FIG. 2, executing on a computing system such as that described with FIGS. 7A and 7B.

At Step 402, a set of parameters of a backup system are received. The parameters may be received from a checkbox style interface, a conversational chatbot style interface, etc.

At Step 405, the set of parameters is processed to generate a graphical representation of the backup system and a bill of materials. The bill of materials identifies the parts used in the backup system. The graphical representation may include a rendering of the backup system with the parts identified from the little materials. The graphical representation may further be interactive to provide for the selection and refinement of parts for the backup system.

At Step 408, the graphical representation of the backup system is presented. In one embodiment, the graphic representation is presented by transmitting the graphical representation to a client device that displays the graphical representation.

At Step 410, a selection for the backup system is received from the graphical representation. In one embodiment, the selection is received in response to a user selection of a part displayed within the graphical representation.

At Step 412, a bill of materials updated with the selection is presented. In one embodiment, updates to the bill materials additionally include updates to a projected time of delivery of the backup system.

While the various steps in this flowchart are presented and described sequentially, at least some of the steps may be executed in different orders, may be combined, or omitted, and at least some of the steps may be executed in parallel. Furthermore, the steps may be performed actively or passively.

The following examples are for explanatory purposes only and not intended to limit the scope of the invention.

Figure 5:
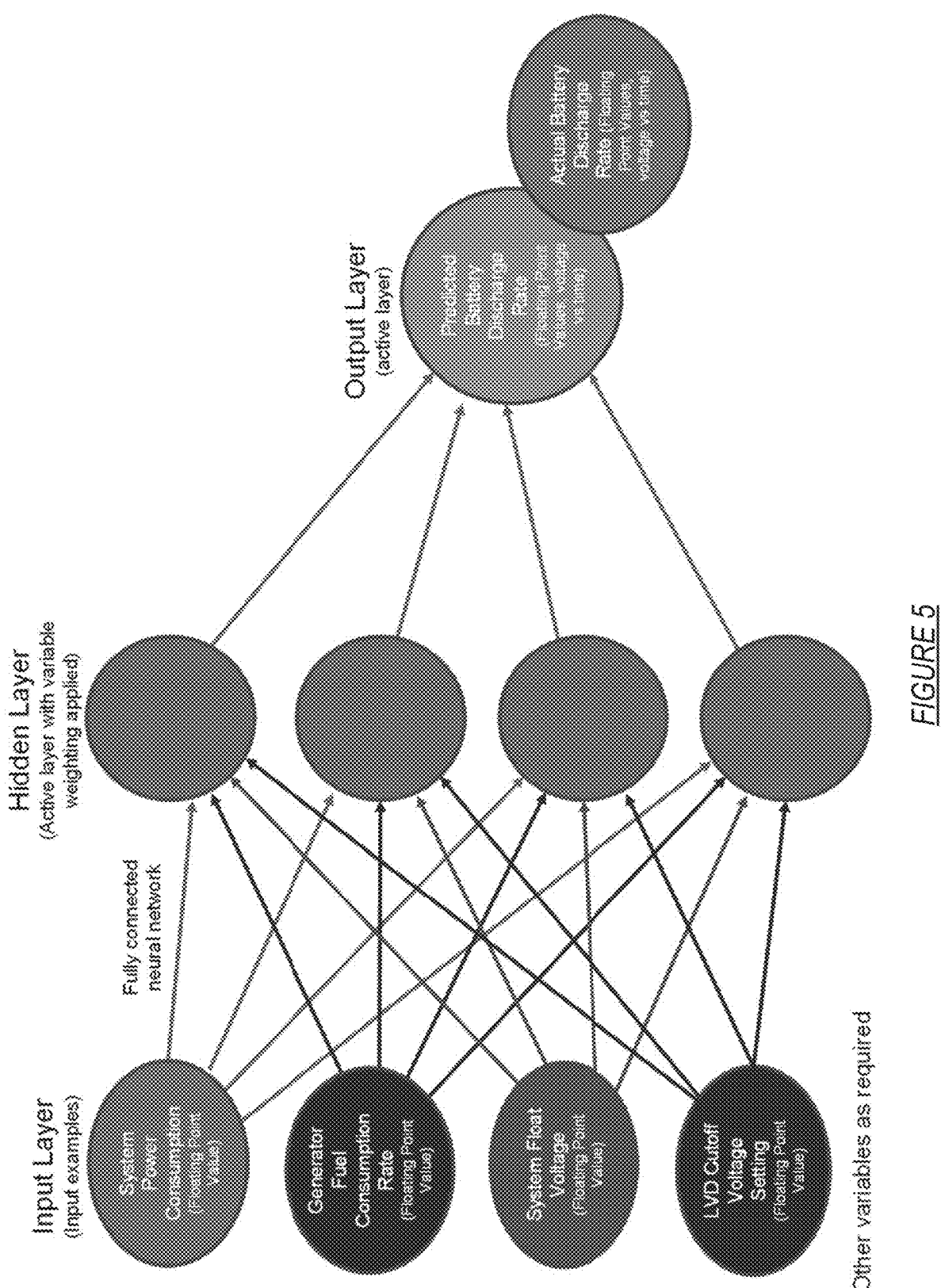
FIG. 5 shows an example of a machine learning training operation according to illustrative embodiments.

Referring now to FIG. 5, an example of a machine learning training operation is shown according to illustrative embodiments. The example illustrated in FIG. 5 can be used to training machine learning model, such as machine learning model (220) of FIG. 2.

FIG. 5 illustrates a machine learning model architecture specifically designed to predict and analyze battery discharge rates based on various system parameters. The depicted neural network configuration is a fully connected neural network topology, including an input layer (510), a hidden layer (520), and an output layer (530).

The input layer (510) serves as the initial point of data entry into the neural network. In this configuration, the input layer (510) comprises multiple nodes, each representing a distinct system parameter that influences battery performance. These parameters include System Power Consumption, Generator Fuel Consumption Rate, System Float Voltage, and LVD Cutoff Voltage Setting, each expressed in floating point values to capture detailed quantitative inputs.

The hidden layer (520) processes inputs received from the input layer (510) through a series of neurons fully connected to both the input layer (510) and output layers (530). Each neuron in the hidden layer (520) applies a variable weighting to its inputs, which are then passed through a non-linear activation function to produce a transformed output. The weights and biases in the hidden layer (520) are adjusted during the training process to minimize the error in the network's predictions. The complexity and depth of the hidden layer (520) can be adjusted based on the required accuracy and the computational resources available, typically involving a trade-off between performance and efficiency.

The output layer (530) is the terminal point of the neural network where the final prediction results are presented. In this example, the output layer (530) provides predictive outcomes for a battery discharge rate, parameterized by floating point values depicting voltage over time.

During the training phase, the predicted discharge rate can then be compared to an actual discharge, backpropagating differences to adjust weights and biases in the hidden layer (520). The model utilizes backpropagation algorithms to adjust the weights and biases of the neurons based on the error in the output compared to expected results. The training involves feeding the network with historical data, where known outputs allow the model to gradually improve its accuracy through iterative adjustments to the network parameters.

Figure 6:
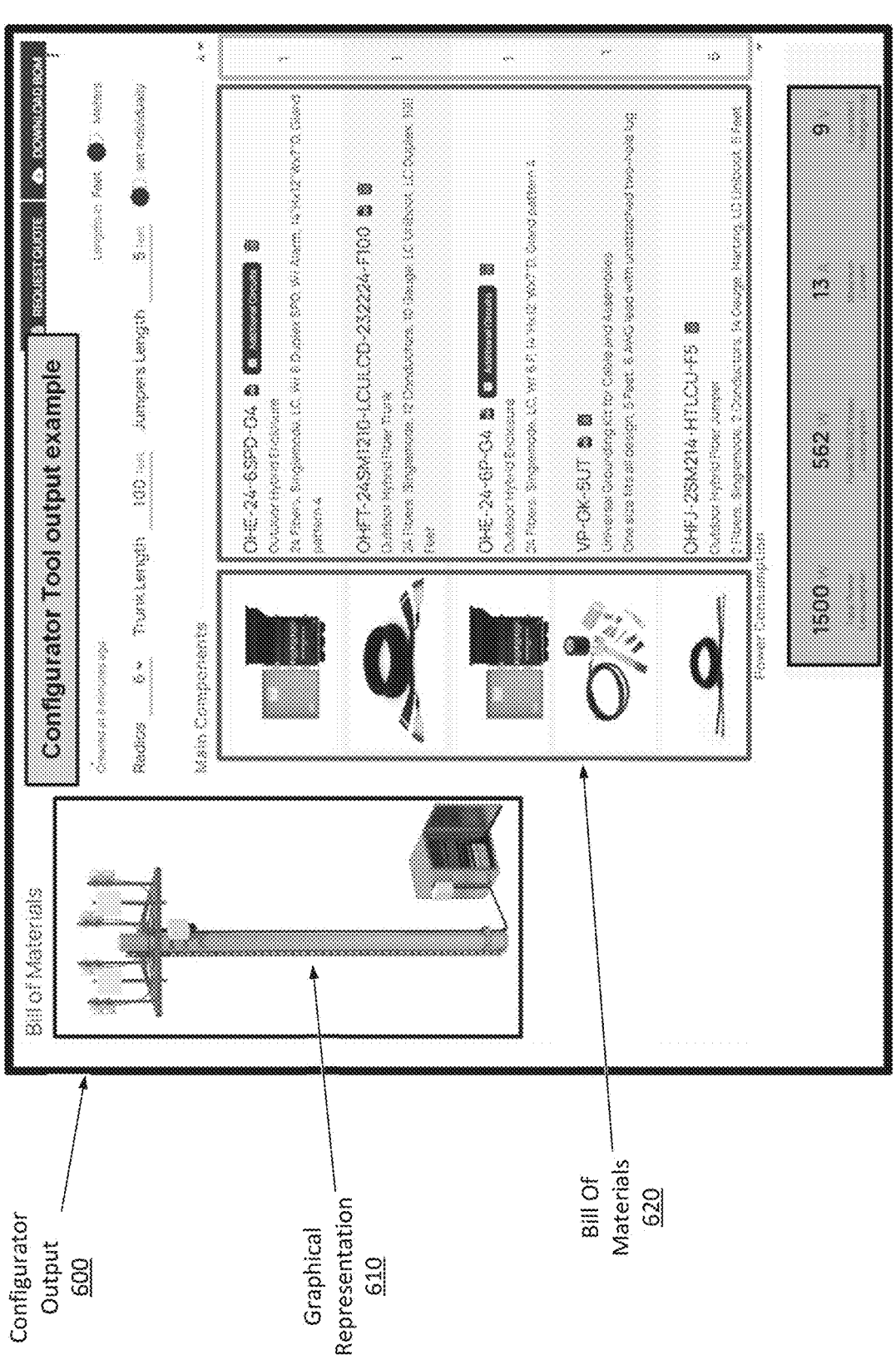
FIG. 6 shows an example of configurator output according to illustrative embodiments.

Turning now to FIG. 6, an example of configurator output is shown according to illustrative embodiments. The configurator output (600) is an example of comparator output 212) of FIG. 2.

The configurator output (600) is organized into distinct components on a user interface (242), providing both a graphical representation and a detailed bill of materials for the deployment of the specified system.

The graphical representation (610) visually represents the configured system, including a cell tower and a server setup. The graphical representation (610) provides a visual verification of the components and their arrangement as specified during the configuration process. Thus, the graphical representation (610) may facilitate an understand the spatial and physical configuration of the system components, enable the selected components to fit within the designated physical spaces and comply with technical and regulatory requirements.

The bill of materials (620) enumerates all the components needed to build the configured system as per user specifications. The bill of materials (620) lists items such as outdoor hybrid enclosures, fiber trunks, grounding kits, and fiber jumpers, specifying quantities and specific models. Each component is accompanied by a small image, a brief description, and an identifier that may link to additional details or the option to modify quantities.

Figure 7A:
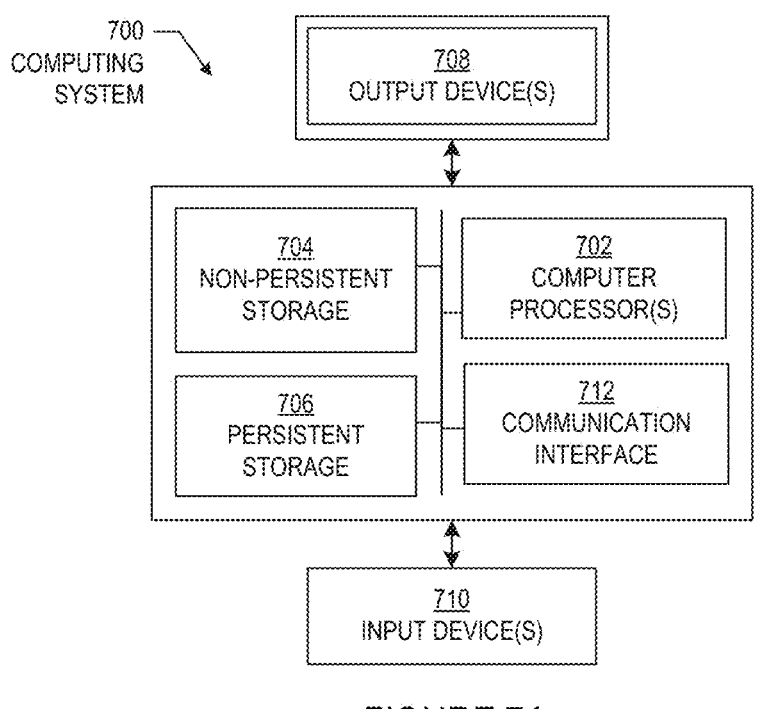
FIG. 7A and FIG. 7B shows a computing system in accordance with one or more embodiments of the invention.

Embodiments may be implemented on a computing system specifically designed to achieve an improved technological result. When implemented in a computing system, the features and elements of the disclosure provide a significant technological advancement over computing systems that do not implement the features and elements of the disclosure. Any combination of mobile, desktop, server, router, switch, embedded device, or other types of hardware may be improved by including the features and elements described in the disclosure. For example, as shown in FIG. 7A, the computing system (700) may include one or more computer processors (702), non-persistent storage (704), persistent storage (706), a communication interface (712) (e.g., Bluetooth interface, infrared interface, network interface, optical interface, etc.), and numerous other elements and functionalities that implement the features and elements of the disclosure. The computer processor(s) (702) may be an integrated circuit for processing instructions. The computer processor(s) (702) may be one or more cores or micro-cores of a processor. The computer processor(s) (702) includes one or more processors. The one or more processors may include a central processing unit (CPU), a graphics processing unit (GPU), a tensor processing unit (TPU), combinations thereof, etc.

The input device(s) (710) may include a touchscreen, keyboard, mouse, microphone, touchpad, electronic pen, or any other type of input device. The input device(s) (710) may receive inputs from a user that are responsive to data and messages presented by the output device(s) (708). The inputs may include text input, audio input, video input, etc., which may be processed and transmitted by the computing system (700) in accordance with the disclosure. The communication interface (712) may include an integrated circuit for connecting the computing system (700) to a network (not shown) (e.g., a local area network (LAN), a wide area network (WAN) such as the Internet, mobile network, or any other type of network) and/or to another device, such as another computing device.

Further, the output device(s) (708) may include a display device, a printer, external storage, or any other output device. One or more of the output devices may be the same or different from the input device(s). The input and output device(s) may be locally or remotely connected to the computer processor(s) (702). Many diverse types of computing systems exist, and the aforementioned input and output device(s) may take other forms. The output device(s) (708) may display data and messages that are transmitted and received by the computing system (700). The data and messages may include text, audio, video, etc., and include the data and messages described above in the other figures of the disclosure.

Software instructions in the form of computer readable program code to perform embodiments may be stored, in whole or in part, temporarily or permanently, on a computer program product that includes a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the invention, which may include transmitting, receiving, presenting, and displaying data and messages described in the other figures of the disclosure.

Figure 7B:
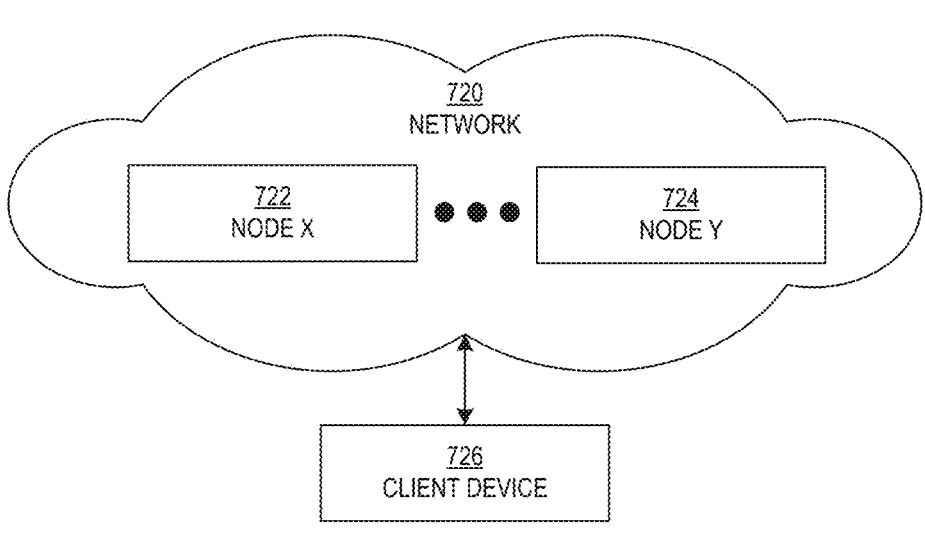

The computing system (700) in FIG. 7A may be connected to or be a part of a network. For example, as shown in FIG. 7B, the network (720) may include multiple nodes (e.g., node X (722), node Y (724)). Each node may correspond to a computing system, such as the computing system shown in FIG. 7A, or a group of nodes combined may correspond to the computing system shown in FIG. 7A. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (700) may be located at a remote location and connected to the other elements over a network.

The nodes (e.g., node X (722), node Y (724)) in the network (720) may be configured to provide services for a client device (726), including receiving requests and transmitting responses to the client device (726). For example, the nodes may be part of a cloud computing system. The client device (426) may be a computing system, such as the computing system shown in FIG. 7A. Further, the client device (726) may include and/or perform all or a portion of one or more embodiments of the invention.

The computing system of FIG. 7A may include functionality to present raw and/or processed data, such as results of comparisons and other processing. For example, presenting data may be accomplished through various presenting methods. Specifically, data may be presented by being displayed in a user interface, transmitted to a different computing system, and stored. The user interface may include a graphical user interface (GUI) that displays information on a display device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

In the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before," "after," "single," and other such terminology. Rather, the use of ordinal numbers is to distinguish between the elements. By way of an example, a first element is distinct from a second element, and the first element may encompass more than one element and succeed (or precede) the second element in an ordering of elements.

Further, unless expressly stated otherwise, "or" is an "inclusive or" and, as such includes "and." Further, items joined by an or may include any combination of the items with any number of each item unless expressly stated otherwise.

The figures of the disclosure show diagrams of embodiments that are in accordance with the disclosure. The embodiments of the figures may be combined and may include or be included within the features and embodiments described in the other figures of the application. The features and elements of the figures are, individually and as a combination, improvements to the technology of keyword extraction using tags and n-grams. The various elements, systems, components, and steps shown in the figures may be omitted, repeated, combined, and/or altered as shown from the figures. Accordingly, the scope of the present disclosure should not be considered limited to the specific arrangements shown in the figures.

In the above description, numerous specific details are set forth in order to provide a more thorough understanding of the invention. However, it will be apparent to one of ordinary skill in the art that the invention may be practiced without these specific details. In other instances, well-known features have not been described in detail to avoid unnecessarily complicating the description. Further, other embodiments not explicitly described above can be devised which do not depart from the scope of the invention as disclosed herein. Accordingly, the scope of the invention should be limited only by the attached claims.

What is claimed is:

1. An apparatus, comprising:
a communications enclosure comprising a generator module;
wherein the generator module comprises:
   a generator;
   a rack mount;
   a signal connector configured to provide an interface for electrical signals to be transmitted to and from the generator;
   a power connector configured to provide an interface for electrical power output to communication equipment in the communications enclosure; and
   vibration isolators positioned between the generator and the signal and power connectors, the vibration isolators configured to reduce transmission of vibrations from the generator to the signal and power connectors.

2. The apparatus of claim 1, wherein the communications enclosure includes lockable doors for secure access to internal components of the communication enclosure.

3. The apparatus of claim 1, wherein the generator module is configured to operate autonomously with connectivity to a power management system for integrated control and monitoring.

4. The apparatus of claim 1, further comprising a control module housed within the communications enclosure, the control module configured to manage power distribution and execute emergency protocols.

5. The apparatus of claim 1, wherein the communications enclosure is equipped with solar panels integrated with electrical converters and storage systems to augment power supply.

6. The apparatus of claim 1, wherein the generator includes a drive engine designed to optimize fuel efficiency through electronic fuel injection and variable valve timing.

7. The apparatus of claim 1, wherein the generator module includes a stator/rotor assembly that converts mechanical energy into electrical energy.

8. The apparatus of claim 1, wherein the vibration isolators configured to minimize the transmission of vibrations from the generator to the communications enclosure.

9. The apparatus of claim 1, wherein the communications enclosure is designed to facilitate installation and maintenance of the generator module.

* * * * *